United States Patent [19]
Joo et al.

[11] Patent Number: 6,096,593
[45] Date of Patent: Aug. 1, 2000

[54] METHOD OF FABRICATING CAPACITOR OF SEMICONDUCTOR DEVICE

[75] Inventors: Jae Hyun Joo, Chungcheongbuk-do; Jeong Min Seon, Chollanam-do, both of Rep. of Korea

[73] Assignee: LG Semicon Co., Ltd., Cheongju-Si, Rep. of Korea

[21] Appl. No.: 09/098,533

[22] Filed: Jun. 17, 1998

[30] Foreign Application Priority Data

Jun. 19, 1997 [KR]  Rep. of Korea ........................ 97-25838

[51] Int. Cl.⁷ ................................................ H01L 21/8234

[52] U.S. Cl. .......................... 438/238; 438/239; 438/240; 438/250; 438/253; 438/393; 438/394; 438/395; 438/396; 438/660; 438/686

[58] Field of Search ..................................... 438/238, 240, 438/239, 250, 253, 393, 394, 395, 396, 660, 686

[56] References Cited

U.S. PATENT DOCUMENTS

| | | | |
|---|---|---|---|
| 4,963,701 | 10/1990 | Yasumoto et al. | 174/256 |
| 5,443,030 | 8/1995 | Ishihara et al. | 117/8 |
| 5,555,486 | 9/1996 | Kingon et al. . | |
| 5,599,424 | 2/1997 | Matsumoto et al. . | |
| 5,714,402 | 2/1998 | Choi | 438/396 |
| 5,736,422 | 4/1998 | Lee et al. | 438/686 |
| 5,790,366 | 8/1998 | Desu et al. | 361/305 |
| 5,869,901 | 2/1999 | Kusuyama | 257/263 |
| 5,932,907 | 8/1999 | Grill et al. | 257/310 |

*Primary Examiner*—John F. Niebling
*Assistant Examiner*—Lynne A. Gurley

[57] ABSTRACT

A method of fabricating a capacitor of a semiconductor device is disclosed including the step of forming a lower electrode layer on a semiconductor substrate, and a dielectric on the lower electrode layer, a part of the lower electrode layer, a part of the upper electrode layer adjacent to the dielectric of the capacitor including the upper electrode on the dielectric, or all of them containing oxygen.

21 Claims, 4 Drawing Sheets

METHOD OF FABRICATING CAPACITOR OF SEMICONDUCTOR DEVICE

BACKGROUND OF THE INVENTION

1. Field of the Invention

The present invention relates to a semiconductor device. More particularly, it relates to a method of fabricating a semiconductor device which reduces the reverse leakage current to improve the characteristics of the semiconductor device.

2. Discussion of Related Art

Miniaturization of electric circuits and integration technology have been developed along with fabricating techniques of semiconductor devices.

16M bit DRAMs and 64M bit DRAMs have been mass-produced, and remarkable progress has been made in the development of semiconductor devices with higher integration. As the integration of DRAM has been increased, the areas of capacitors are significantly decreased, and the improvement in techniques of fabricating a capacitor for securing the same capacitance in a decreased area has become an important issue. There are many propositions to solve the leakage current problem in electrode layers constituting capacitors.

Referring to the drawings, a capacitor of a conventional semiconductor device is now described.

FIG. 1 depicts a conventional semiconductor device with a capacitor, and FIG. 2 graphically shows an oxygen atom migration route of the capacitor's upper electrode. FIG. 3 graphically shows the leakage current characteristics of a conventional capacitor. In line with the trend of reduction in the size of DRAM, there has been proposed a technique of manufacturing a DRAM capacitor by the use of a high dielectric such as BST, ST, PZT, PLZT, etc. The improved effective capacitance can be achieved with a simple stacked-type capacitor, as opposed to a complex three dimensional structure, in the manufacture of a capacitor using the high dielectric. A capacitor is made with Pt having low reactivity and large work function, and a thin Pt film is made by sputtering.

Cell transistors (not shown) are formed on a semiconductor substrate 1 to form a capacitor of a semiconductor device. As shown in FIG. 1, an interlayer insulating layer 2 is formed all over the surface of the substrate 1 including the cell transistors and is selectively removed to form a contact hole. A plug layer 3 is formed to bury the contact hole by the use of polysilicon. A diffusion barrier layer 4, contacting plug layer 3 (for preventing atomic migration between the plug layer and a lower electrode), a lower electrode 5 of Pt, and spacers 6 are formed.

A dielectric 7 is formed all over the surface of the substrate 1 including lower electrode layer 5, and an upper electrode layer 8 is formed on dielectric 7 using Pt.

In the formation of the capacitor, lower electrode 5 and the dielectric 7 are formed, and a Pt target is sputtered by the use of Ar gas to form upper electrode 8 (a thin Pt film). Oxygen of dielectric 7 passes through Pt upper electrode 8 deposited on dielectric 7, as shown in FIG. 2 so that an oxygen depletion layer is formed on the surface of dielectric 7; thus representing the oxygen distribution as shown in FIG. 2. The dielectric's leakage current characteristics depend on the oxygen density within the dielectric, and the leakage current characteristics vary with the density of oxygen existing at the interface between the electrodes.

In the process of fabricating a capacitor of a semiconductor device, when forming an upper electrode layer on the dielectric, the dielectric is exposed to plasma to change the oxygen density. The current size in the upper electrode layer is larger than that of the lower electrode layer, as shown in FIG. 3. The forward and reverse leakage currents should be maintained below $1\times10^{-7}$A/cm 2, and the reverse leakage current becomes large in the conventional capacitor to deteriorate the semiconductor device.

SUMMARY OF THE INVENTION

Accordingly, the present invention is directed to a method of fabricating a capacitor of a semiconductor device that substantially obviates one or more of the problems due to limitations and disadvantages of the related art.

An object of the present invention is to provide a method of fabricating a capacitor of a semiconductor device whereby the reverse leakage current is effectively reduced to enhance the semiconductor device's characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention discloses a method of fabricating a capacitor of a semiconductor device including the step of forming a lower electrode layer on a semiconductor substrate, and a dielectric on the lower electrode layer, a part of the lower electrode layer, a part of the upper electrode layer adjacent to the dielectric of the capacitor including the upper electrode on the dielectric, or all of them containing oxygen.

According to another aspect of the present invention, a method of fabricating a capacitor of a semiconductor device includes the steps of depositing a Pt thin film on a semiconductor substrate having cell transistors by a sputtering technique using Ar gas, thus forming a lower electrode layer; forming a dielectric on the lower electrode layer; and depositing a Pt thin film containing oxygen on the dielectric by a sputtering technique introducing the Ar gas and oxygen gas at the same time, thus forming an upper electrode layer.

According to still another aspect of the present invention, a method of fabricating a capacitor of a semiconductor device includes the steps of depositing a Pt thin film on a semiconductor substrate having cell transistors by a sputtering technique using Ar gas, thus forming a lower electrode layer; forming a dielectric on the lower electrode layer; and first depositing a Pt thin film containing oxygen on the dielectric by the sputtering technique using the Ar gas and oxygen gas at the same time, and second depositing a Pt thin film by the sputtering technique, thus forming an upper electrode layer.

According to still another aspect of the present invention, a method of fabricating a capacitor of a semiconductor device includes the steps of first depositing a Pt thin film on a semiconductor substrate having cell transistors by a sputtering technique using Ar gas, and second depositing a Pt thin film containing oxygen, thus forming a lower electrode layer; forming a dielectric on the lower electrode layer; and first depositing a Pt thin film containing oxygen or the dielectric by the sputtering technique introducing the Ar gas and oxygen gas at the same time, and second depositing a Pt thin film by the sputtering technique, thus forming an upper electrode layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 1 shows a capacitor of a conventional semiconductor device;

FIG. 2 graphically depicts the migration of oxygen atom of the conventional capacitor's upper electrode and oxygen density;

FIG. 3 graphically depicts the leakage current characteristics of the conventional capacitor;

FIGS. 4A to 4C each graphically depict a capacitor of a semiconductor device and the oxygen density in accordance with first, second and third preferred embodiments of the present invention; and FIGS. 5A and 5B graphically show the leakage current characteristics of a capacitor of a semiconductor device in accordance with the present invention.

DETAILED DESCRIPTION OF PREFERRED EMBODIMENT

Reference will now be made in detail to the preferred embodiments of the present invention, examples of which are illustrated in the accompanying drawings.

Figure 1:
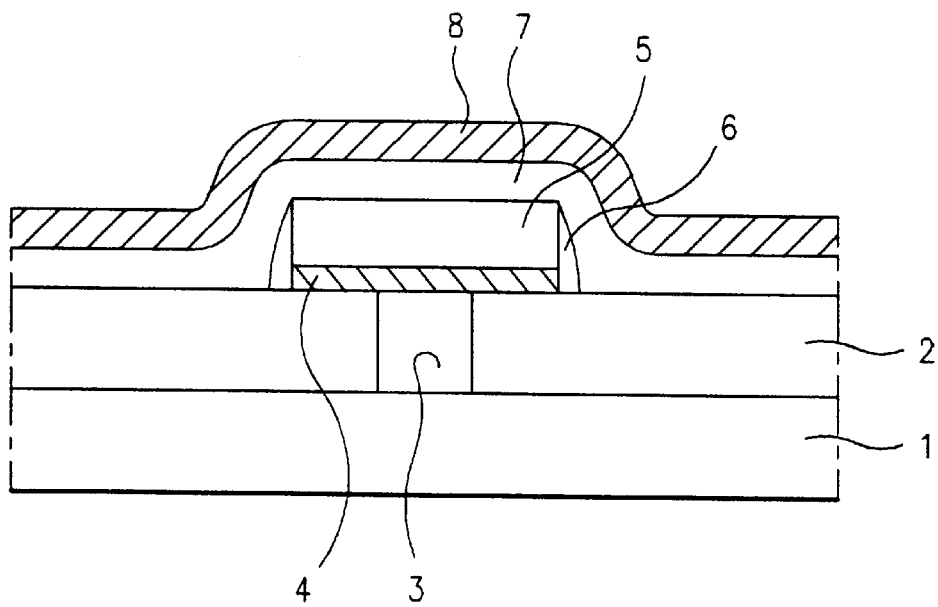
Figure 2:
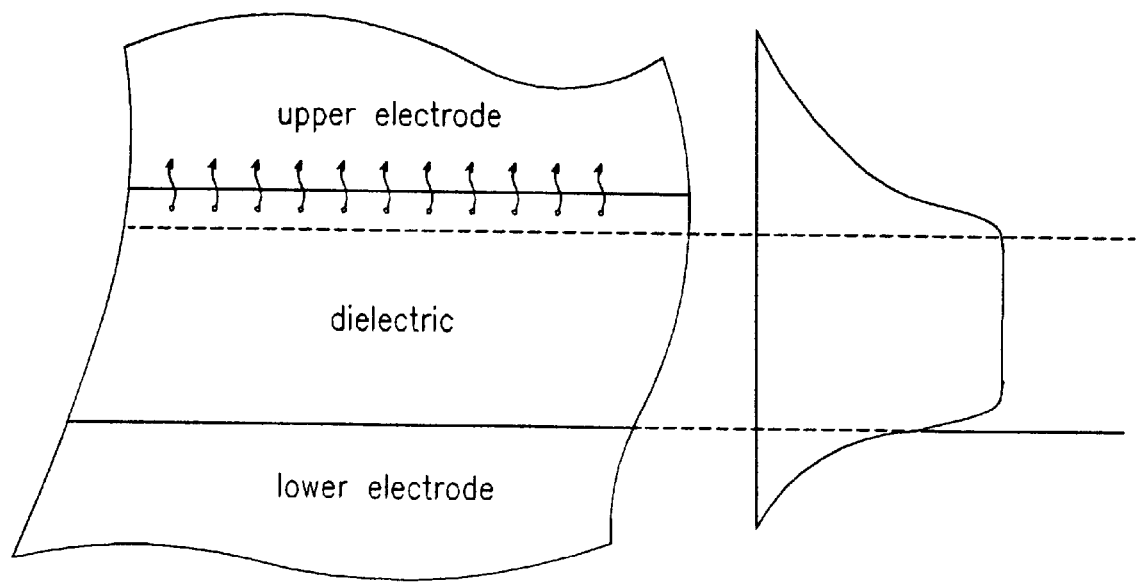
Figure 3:
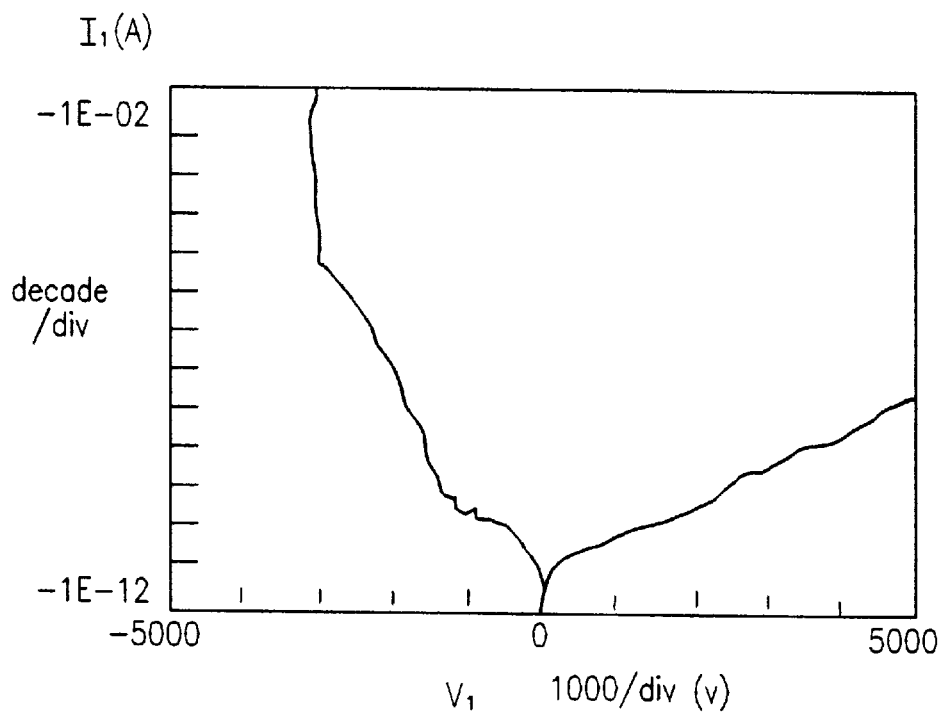
Figure 4A:
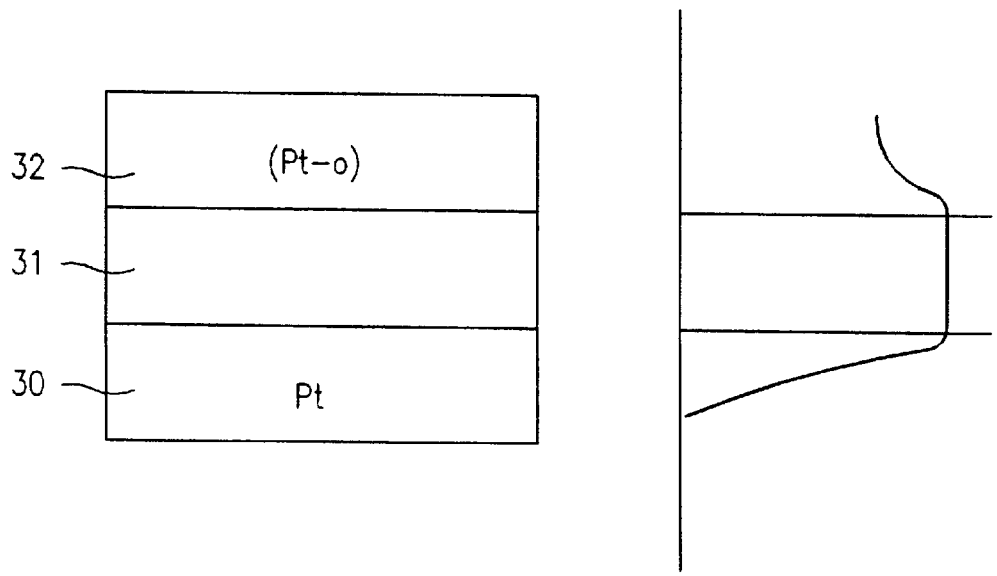
Figure 4B:
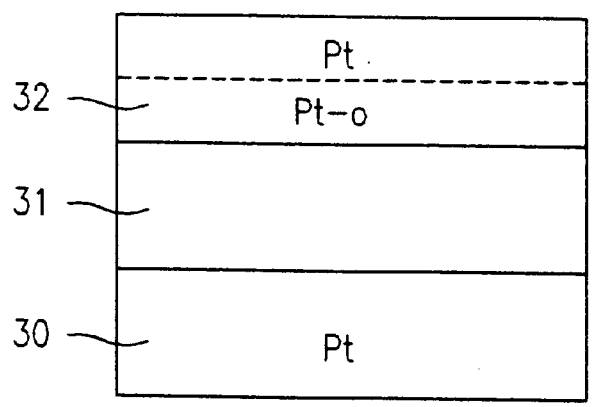
Figure 4B:
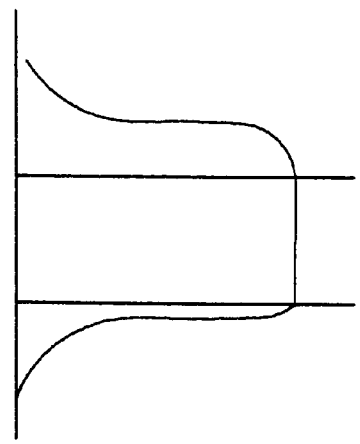
Figure 4C:
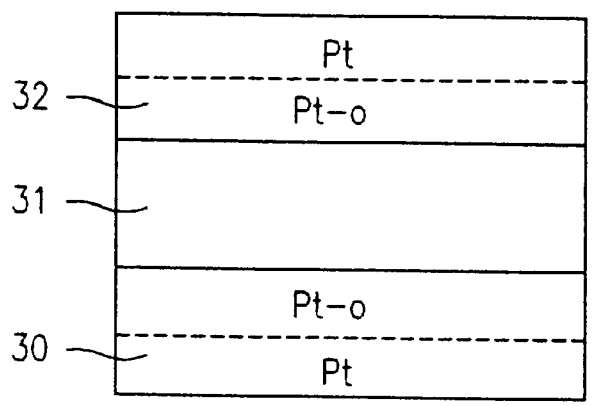
Figure 4C:
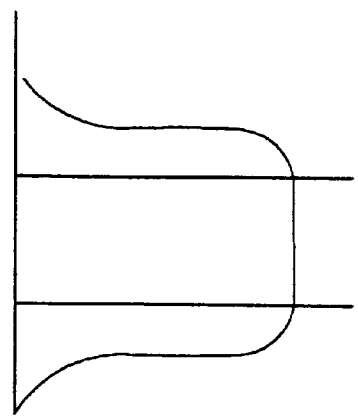
Figure 5A:
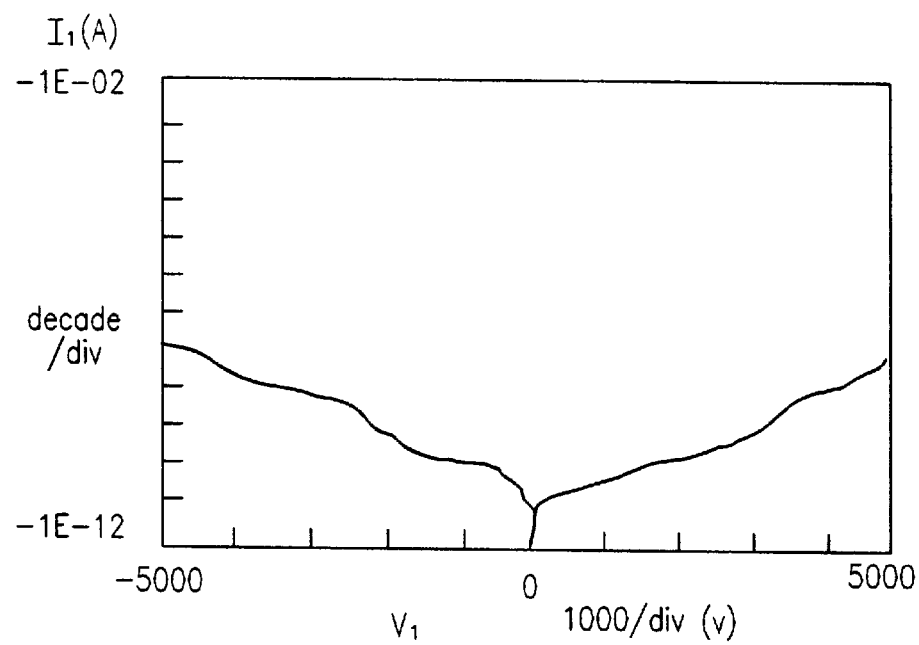
Figure 5B:
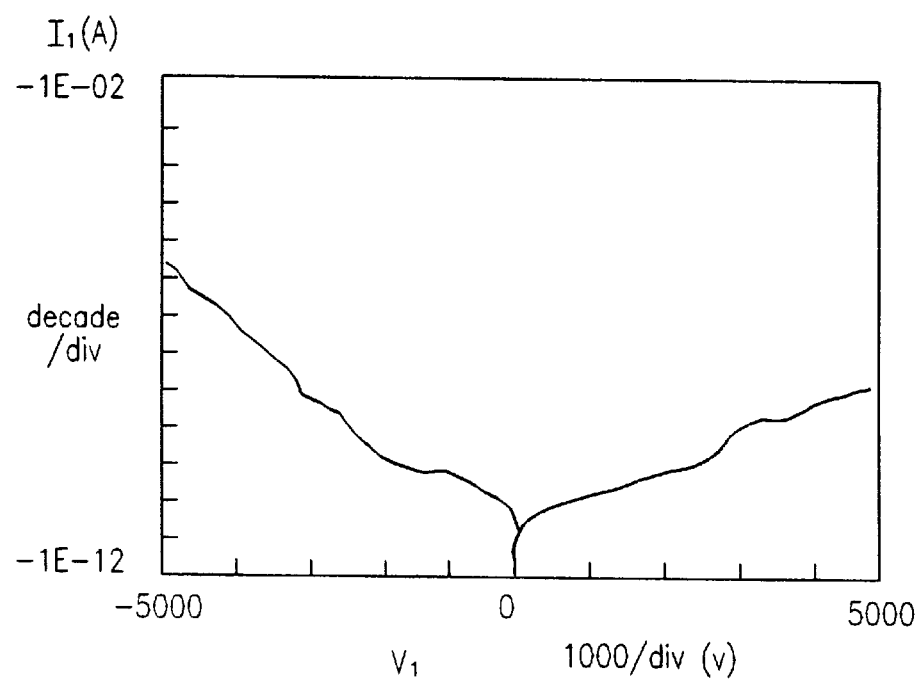

FIG. 4A to 4C each graphically depict a capacitor of a semiconductor device and the oxygen density in accordance with first, second and third preferred embodiments of the present invention. FIGS. 5A and 5B graphically show the leakage current characteristics of a capacitor of a semiconductor device in accordance with the present invention.

When forming an upper electrode 32 or lower electrode 30 to reduce the leakage current of the capacitor, the oxygen distribution in upper electrode 32 and lower electrode 30 adjacent to a dielectric 31 is controlled by inducing oxygen gas to reduce forward and reverse leakage currents.

A method of fabricating a capacitor of a semiconductor device in accordance with the first preferred embodiment of the present invention includes the steps of forming dielectric 31 on lower electrode 30 made of Pt (FIG. 4A); adding oxygen gas to Ar gas during sputtering for the formation of upper electrode 32 on dielectric 31 to deposit a thin Pt film. The Ar gas is introduced to an electrode target of the sputtering equipment, and oxygen gas is introduced toward the substrate. Dielectric 31 is formed by using $ABO_3$ (A=Ba, Sr, Pb, La; B=Zr, Ti, etc.). Lower electrode 30 is formed on a polysilicon plug layer, or adhesion layer made of Ti, Zr or a diffusion barrier layer made of TiN, TaN, TiW, etc. The above polysilicon plug layer, adhesion layer or diffusion barrier layer contacts an impurity diffusion region (not shown) of one side of cell transistors.

In the method of fabricating a capacitor according to the first preferred embodiment of the present invention, the addition of oxygen (20 sccm) to Ar gas (20 sccm) used in the sputtering process to control the distribution of oxygen density at the time of forming upper electrode layer 32 prevents oxygen from being removed from dielectric 31 to avoid reverse leakage current.

FIG. 4B depicts a capacitor of a semiconductor device in accordance with a second preferred embodiment of the present invention.

The second preferred embodiment is to prevent a decrease in the deposition speed that may occur by the addition of Ar gas and oxygen gas. A dielectric 31 is formed on lower electrode layer 30, made of e.g. Pt, by the use of $ABO_3$ (A=Ba, Sr, Pb, La B=Zr, Ti, etc.) Ar gas (20 sccm) and oxygen gas (20 sccm) are simultaneously introduced to the sputtering equipment, thus first forming a Pt thin film containing oxygen on the dielectric 31. Then, a Pt thin film, not containing oxygen, is formed by the use of Ar gas (40 sccm) only. Upper electrode 30 is formed on a polysilicon plug layer, an adhesion layer of Ti, Zr, etc. or a diffusion barrier layer of TiN, TaN, TiW, etc. The polysilicon plug layer or adhesion layer or diffusion barrier layer contacts an impurity diffusion region (not shown) of one side of cell transistors formed on a semiconductor substrate.

FIG. 4C depicts a capacitor of a semiconductor device in accordance with a third preferred embodiment of the present invention.

This third preferred embodiment of the present invention is to prevent a decrease in the deposition speed that may occur by the addition of Ar gas and oxygen gas. In this embodiment, Pt thin a film containing oxygen is also applied to lower electrode layer 30.

When forming lower electrode layer 30 using Pt, a Pt thin film is first formed by the use of Ar gas (40 sccm) only, and Ar gas (20 sccm) and oxygen gas (20 sccm) are simultaneously introduced into the sputtering equipment thereafter; thus forming lower electrode 30 as a Pt thin film containing oxygen and a Pt thin film, not containing oxygen. A dielectric 31 is formed by the use of $ABO_3$ (A=Ba, Sr, Pb, La B=Zr, Ti, etc.) on lower electrode 30 having the Pt thin film containing oxygen and the Pt thin film not containing oxygen. Ar gas (20 sccm and oxygen gas (20 sccm) are introduced to the sputtering equipment on dielectric 31, thus first forming a Pt thin film containing oxygen. A second Pt thin film, not containing oxygen, is then formed by the use of Ar gas (40 sccm) only.

Upper electrode layer 32 is formed as a Pt thin film containing oxygen and a Pt thin film, not containing oxygen. Lower electrode 30 is formed on a polysilicon plug layer, an adhesion layer made of Ti, Zr, etc. or a diffusion barrier layer, such as TiN, TaN, TiW, etc. The polysilicon plug layer adhesion layer or diffusion barrier layer contacts an impurity diffusion region (not shown) of one side of cell transistors formed on a semiconductor substrate.

The process of forming the Pt thin film according to the first, second and third preferred embodiments of the present invention is carried by a CVD, evaporation, laser evaporation method, etc.

The inventive method of the semiconductor device, as shown in FIGS. 5A and 5B, assures the excellent forward/reverse leakage current characteristics of the present invention.

In FIG. 5A Ar gas and oxygen gas are simultaneously induced to the sputtering equipment only when forming upper electrode 32 thereby forming the Pt thin film containing oxygen, which shows that the reverse leakage current characteristics are excellent as well as the forward leakage current characteristics. FIG. 5B graphically depicts the leakage current characteristics of the capacitor with the Pt thin film formed by simultaneously inducing Ar gas and oxygen gas to the sputtering equipment in the formation of both upper and lower electrode layers 30 and 32. FIG. 5B graphically shows the leakage current characteristics of the capacitor with the Pt thin film formed by introducing Ar gas and oxygen gas at the time of forming upper and lower electrode layers 30 and 32, and its forward and reverse leakage current characteristics are superior to those of FIG. 5A.

As described above, according to the inventive method of fabricating a capacitor of a semiconductor device, a part of the Pt thin film contains oxygen to control the oxygen distribution on the surface between the dielectric and the Pt thin film, thus improving the forward/reverse leakage current characteristics of the capacitor and the characteristics of a semiconductor device.

It will be apparent to those skilled in the art that various modifications and variations can be made in the inventive method of fabricating a capacitor of a semiconductor device without departing from the spirit or scope of the invention. Thus, it is intended that the present invention cover the modifications and variations of this invention provided they come within the scope of the appended claims and their equivalents.

What is claimed is:

1. A method of fabricating a capacitor of a semiconductor device comprising the steps of:

depositing a Pt thin film on a semiconductor substrate having cell transistors by a sputtering technique using Ar gas, thus forming a lower electrode layer;

forming a dielectric on the lower electrode layer; and depositing a Pt thin film containing oxygen on the dielectric by a sputtering technique introducing the Ar gas and oxygen gas in a ratio of 1 to 1 at the same time, thus forming an upper electrode layer.

2. A method according to claim 1, wherein the Ar gas and oxygen gas used in the sputtering process for forming the upper electrode layer are each 20 sccm.

3. A method according to claim 1, wherein the Ar gas is introduced to an electrode target of a sputtering equipment in the sputtering process, and the oxygen gas is introduced into the substrate.

4. A method according to claim 1, wherein the dielectric is formed by the use of $ABO_3$ (A=Ba, Sr, Pb, La B=Zr, Ti).

5. A method according to claim 1, wherein the lower electrode layer is formed on a polysilicon plug layer or an adhesion layer or a diffusion barrier layer, contacting an impurity diffusion region of one side of cell transistors.

6. A method according to claim 5, wherein the adhesion layer is made of Ti, Zr or an alloy containing one of Ti or Zr.

7. A method according to claim 5, wherein the diffusion barrier layer is made of TiN, TaN or TiW.

8. A method of fabricating a capacitor of a semiconductor device comprising the steps of:

depositing a Pt thin film on a semiconductor substrate having cell transistors by a sputtering technique using Ar gas, thus forming a lower electrode layer;

forming a dielectric on the lower electrode layer;

first depositing a Pt thin film containing oxygen on the dielectric by the sputtering technique using the Ar gas and oxygen gas in a ratio of 1 to 1 at the same time; and second depositing a Pt thin film by the sputtering technique, thus forming an upper electrode layer.

9. A method according to claim 8, wherein the Ar gas and oxygen gas used in the sputtering process for forming the upper electrode layer are each 20 sccm.

10. A method according to claim 8, wherein the Ar gas is introduced to an electrode target of a sputtering equipment in the sputtering process for depositing the Pt thin film containing the oxygen of the upper electrode layer, and oxygen gas is introduced into the substrate.

11. A method according to claim 8, wherein the dielectric is formed by the use of $ABO_3$ (A=Ba, Sr, Pb, La B=Zr, Ti).

12. A method according to claim 8, wherein the lower electrode layer is formed on a polysilicon plug layer, an adhesion layer, or a diffusion barrier layer, contacting an impurity diffusion region of one side of cell transistors.

13. A method according to claim 12, wherein the adhesion layer is made of Ti, Zr or an alloy containing one of Ti or Zr.

14. A method according to claim 12, wherein the diffusion barrier layer is made of TiN, TaN of TiW.

15. A method of fabricating a capacitor of a semiconductor device comprising the steps of:

first depositing a Pt thin film on a semiconductor substrate having cell transistors by a sputtering technique using Ar gas, and second depositing a Pt thin film containing oxygen, thus forming a lower electrode layer;

forming a dielectric on the lower electrode layer;

first depositing a Pt thin film containing oxygen on the dielectric by the sputtering technique introducing the Ar gas and oxygen gas in a ratio of 1 to 1 at the same time; and second depositing a Pt thin film by the sputtering technique, thus forming an upper electrode layer.

16. A method according to claim 15, wherein the Ar gas and oxygen gas, used in the sputtering process for forming the Pt thin film containing oxygen of the upper electrode layer or lower electrode layer, are each 20 sccm.

17. A method according to claim 15, wherein the Ar gas is introduced to an electrode target of a sputtering equipment in the sputtering process for depositing the Pt thin film containing the oxygen of the upper electrode layer, and the oxygen gas is introduced into the substrate.

18. A method according to claim 15, wherein the dielectric is formed by the use of $ABO_3$ (A=Ba, Sr, Pb, La B=Zr, Ti).

19. A method according to claim 15, wherein the lower electrode layer is formed on a polysilicon plug layer, an adhesion layer, or a diffusion barrier layer, contacting an impurity diffusion region of one side of cell transistors.

20. A method according to claim 19, wherein the adhesion layer is made of Ti, Zr or an alloy,containing one of Ti or Zr.

21. A method according to claim 19, wherein the diffusion barrier layer is made of TiN, TaN or TiW.

* * * * *